United States Patent [19]

Medina

[11] 4,384,249

[45] May 17, 1983

[54] CABLE TESTING APPARATUS AND METHOD

[76] Inventor: Alvaro Medina, 714 Lincoln Pl., Boulder, Colo. 80302

[21] Appl. No.: 184,573

[22] Filed: Sep. 5, 1980

[51] Int. Cl.³ .............................................. G01R 31/02
[52] U.S. Cl. ........................................ 324/51; 324/66
[58] Field of Search ....................... 324/51, 66, 73 R; 179/175.3 F

[56] References Cited

U.S. PATENT DOCUMENTS

| 3,594,635 | 7/1971 | Minamii et al. | 324/51 |
| 3,665,299 | 5/1972 | Yarbrogh | 324/51 |
| 3,763,430 | 10/1973 | Terrey | 324/51 X |
| 3,784,910 | 1/1974 | Sylvan | 324/51 X |
| 3,792,349 | 2/1974 | Bobbitt | 324/51 |
| 3,818,329 | 6/1974 | Reaves, Jr. | 324/51 |
| 3,825,824 | 7/1974 | Herron et al. | 324/51 |
| 3,859,988 | 1/1975 | Lencioni, Jr. | 324/51 X |
| 3,893,024 | 7/1975 | Reines et al. | 324/51 |
| 3,944,914 | 3/1976 | Simmonds | 324/51 |
| 3,986,106 | 10/1976 | Shuck | 324/51 |
| 3,999,126 | 12/1976 | Gabor et al. | 324/51 X |
| 4,015,200 | 3/1977 | Strandh | 324/51 |
| 4,052,694 | 10/1977 | Fredriksson | 324/51 X |
| 4,074,187 | 2/1978 | Miller et al. | 324/51 |
| 4,134,099 | 1/1979 | Lankford, Jr. | 324/51 X |
| 4,224,690 | 9/1980 | Rockwell | 324/51 X |
| 4,282,479 | 8/1981 | Deboo et al. | 324/51 |

Primary Examiner—Stanley T. Krawczewicz
Attorney, Agent, or Firm—O'Rourke & Harris

[57] ABSTRACT

A cable testing apparatus and method are disclosed, the apparatus and method being particularly useful as a seismic cable tester to enable rapid cable check-out, and, as a battery operated portable unit, being particularly useful for final check-outs in field operations. The wires of a multi-wire cable are sequentially tested by pairs with sequential testing being interrupted and an indication of the pair of wires then found to be open being displayed each time an open is sensed. The apparatus includes electrical control circuitry for controlling multiplexing of the wire pairs of the cable to be tested and for determining the display to be presented so that the display is indicative of each pair of wires of the cable found to be open.

19 Claims, 5 Drawing Figures

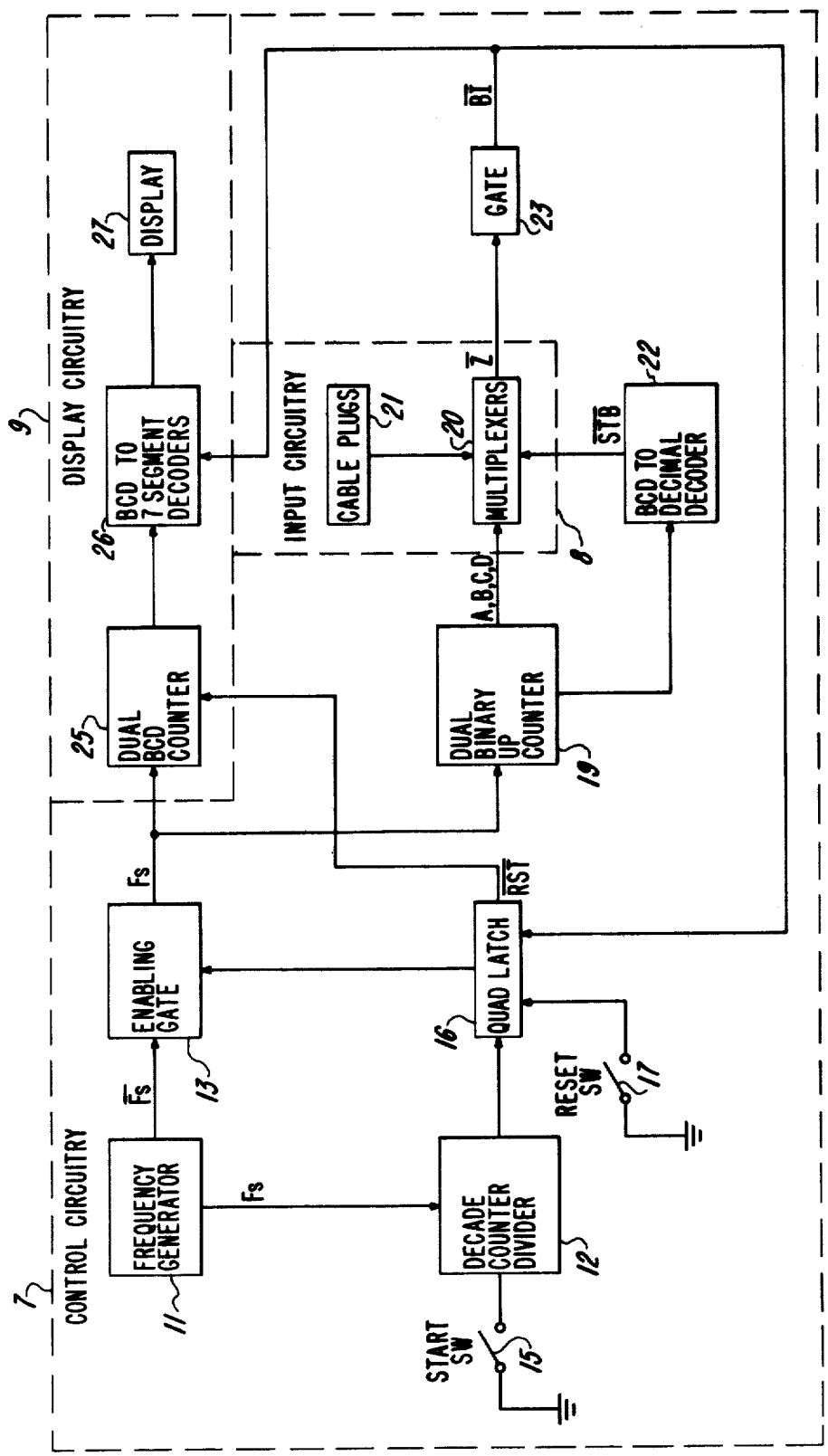
Fig_1

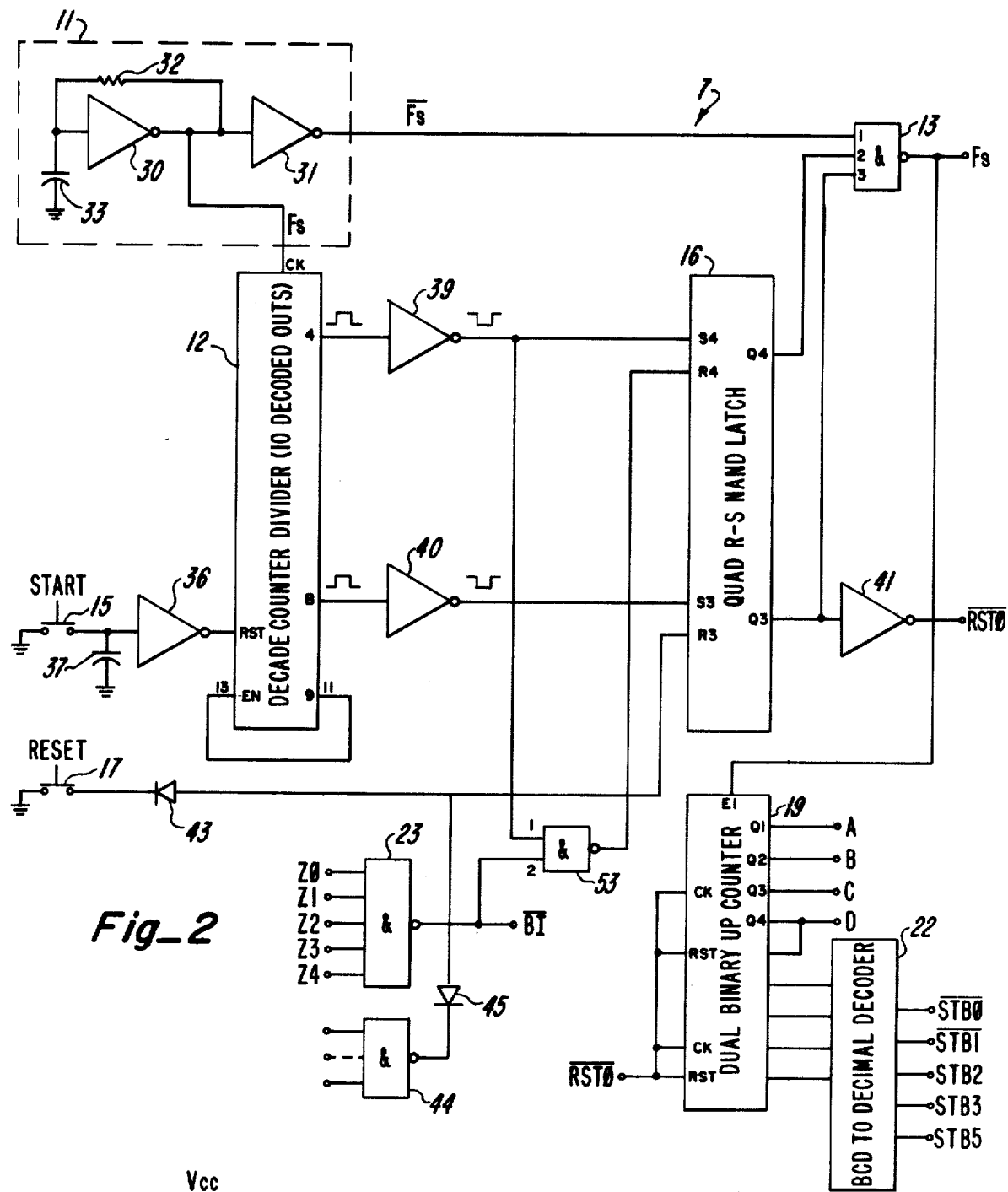
Fig_2
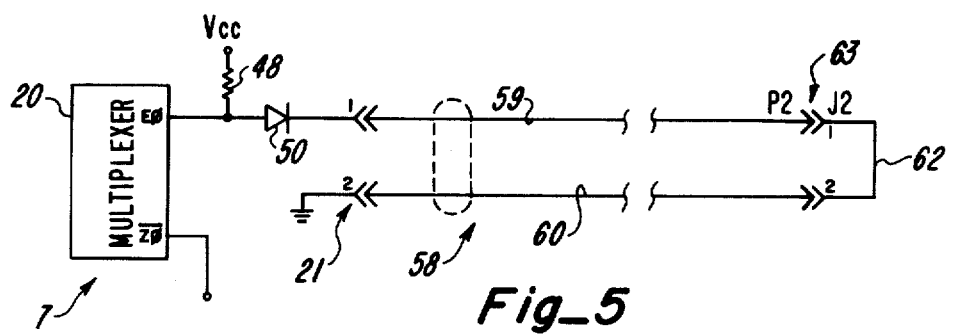
Fig_5

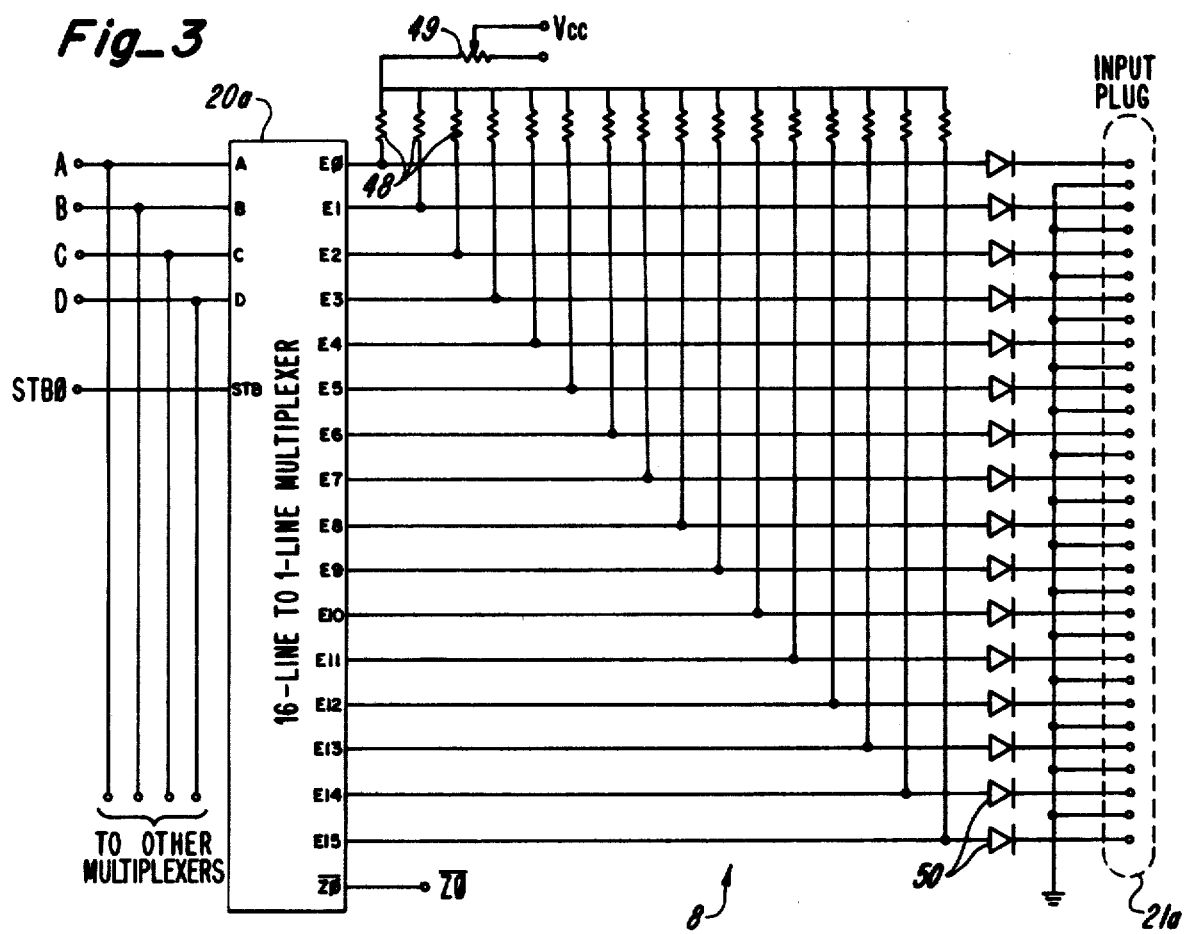
Fig_3
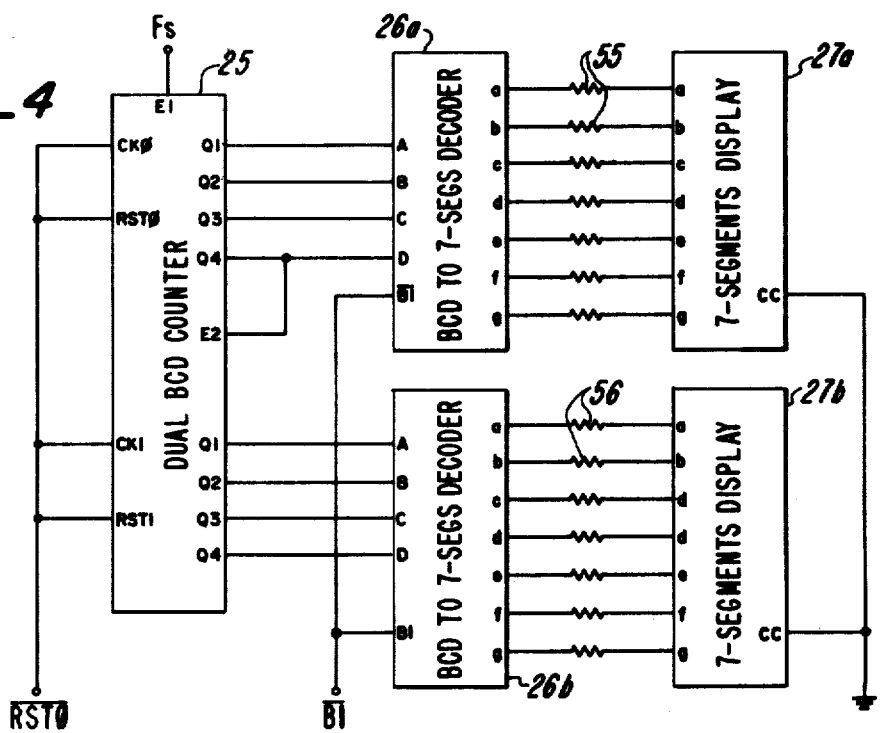
Fig_4

CABLE TESTING APPARATUS AND METHOD

FIELD OF THE INVENTION

This invention relates to a cable testing apparatus and method and, more particularly, relates to a portable apparatus and a method that is particularly well suited for testing of seismic cables.

BACKGROUND OF THE INVENTION

The use of multi-wire electrical cables has increased over the last few years, and this has, of course, increased the need for assuring that all of the wires included in such a cable are in good operating condition. When one or more wires included in the cable become open, as can occur, for example, by the wire being broken somewhere between the opposite ends, this reduces the overall effectiveness of the cable and, in at least some cases, makes the cable unsatisfactory for its intended use.

It has therefore been quite important, at least for some uses, that all of the wires included in the cable be reliable in transmitting electrical signals through each of the wires included in the cable. This is particularly important for a multi-wire cable that is to be used as a seismic cable. Therefore, it is desirable that such a cable be tested during final check-outs in field operations to assure reliability.

While various devices and/or methods for checking multi-wire cables have been heretofore suggested and/or utilized, none has been fully satisfactory in providing a relatively simple, portable unit and a method that can be utilized to rapidly check all of the wires of a cable and reliably indicate wires in the cable that are open.

Multi-conductor cable testing apparatus and methods are known in the prior art, and such apparatus is shown, for example, in U.S. Pat. Nos. 4,134,099; 4,074,187; 4,052,694; 4,015,200; 3,986,106; 3,944,914; 3,665,299; and 3,594,635.

SUMMARY OF THE INVENTION

This invention provides an improved cable testing apparatus and method that are particularly useful for testing multi-wire seismic cables. The wires of the cable are sequentially monitored by pairs with monitoring being interrupted whenever a pair of wires is sensed to be open and an indication is displayed of that wire pair sensed as open.

It is therefore an object of this invention to provide an improved cable testing apparatus and method.

It is another object of this invention to provide an improved cable testing apparatus and method for testing multi-wire seismic cables.

It is another object of this invention to provide an improved cable testing apparatus and method for sequentially monitoring the wires of a multi-wire cable by pairs, interrupting sequential monitoring when an open is sensed, and displaying an indication of the wire pair then sensed to be open.

It is still another object of this invention to provide an improved cable testing apparatus that is portable and reliable for use in final check-out of seismic cables for field operation.

It is still another object of this invention to provide an improved cable testing apparatus that includes control circuitry for testing the wires of a multi-wire cable by pairs and indicating opens sensed in all such pairs.

It is yet another object of this invention to provide an improved cable testing apparatus that includes multiplexing between pairs of a multi-wire cable to be tested under the control of control circuitry which also determines the indication to be displayed to identify all opens found during multiplexing.

With these and other objects in view, which will become apparent to one skilled in the art as the discription proceeds, this invention resides in the novel construction, combination, and arrangement of parts substantially as hereinafter described, and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application and the principles thereof, and in which;

FIG. 1 is a block diagram of the cable testing apparatus of this invention;

FIG. 2 is a block and schematic diagram of the control circuitry of the invention as shown in FIG. 1;

FIG. 3 is a block and schematic diagram of the input circuitry of the invention as shown in FIG. 1;

FIG. 4 is a block and schematic diagram of the display circuitry of the invention as shown in FIG. 1; and FIG. 5 is a partial block and schematic diagram illustrating use of the invention in identifying an open in a pair of wires of a multi-wire cable.

DESCRIPTION OF THE INVENTION

The apparatus of this invention provides a cable tester that is particularly useful as a seismic cable tester to perform final cable check-outs in field operations under any weather conditions. The tester utilizes solid-state design, is lightweight and fully portable, is battery operated (perferrably powered internally through the use of an internal 12 volt battery), can be built to test any number of wires of a cable (160 conductors is the normal capability of the tester, described herein, but such tester can be expanded or contracted as would be obvious to one skilled in the art to accommodate cables with different numbers of conductors), utilizes easy push-button operation, provides a full scan in about 90 milliseconds, and provides a digital seven segment readout at the tester.

The apparatus of this invention scans sequentially, by pairs, through the wires of a multi-wire cable, and normally detects for each pair a ground level that is indicative of an unbroken electrical path through the pair of wires. When the ground level is not detected, this is an indication that one of the two wires of the pair then being tested is open (i.e., there is no unbroken electrical path through the pair of wires). When an open is sensed by the apparatus, scanning is terminated and an indication is displayed of the pair of wires then sensed to be open. Scanning is initiated and/or resumed by manual actuation of a start switch, and the apparatus can be reset to zero, when desired, by a manual reset switch.

Referring to FIG. 1, the apparatus of this invention is shown to include control circuitry 7, input circuitry 8, and display, or indicating, circuitry 9. Control circuitry 7 includes a frequency generator 11 which provides an output signal ($f_s$) at a predetermined frequency to decade counter divider 12 and a second output signal ($f_s$)

to enabling gate 13. Counter divider 12 is caused to be reset to zero each time that start switch 15 is activated to the closed position (switch 15 is preferably normally biased to the open position). When start switch 15 is released to open the switch, this causes counter divider 12 to start counting and place high level pulses at the outputs which are coupled to quad latch 16. Quad latch 16 can be manually reset by reset switch 17 (which switch is preferably biased to the open position like switch 15).

The output signal ($f_s$) from enabling gate 13 is controlled by quad latch 16 with the signal ($f_s$) being coupled from gate 13 to dual binary up counter 19. Counter 19 provides control signals (A, B, C and D) to multiplexers 20 for sequential testing by pairs of a multi-wire cable that is connected at one end with each multiplexer by means of cable plugs 21. Cable plugs 21 are preferably Amphib 122 plugs but can be any plug desired by a user.

Multiplexers, or signal routing means, 20 include a plurality of multiplexer units as may be necessary to handle the number of wires in the cable to be tested. For a multi-wire cable of 80 pairs (160 conductors), for example, five multiplexer units can be utilized where each multiplexer unit is capable of handling sixteen wires. When a plurality of multiplexer units are utilized, the units are separately activated by BCD to decimal decoder 22 which receives an input signal from dual binary up counter 19. The output from multiplexers ($\overline{Z}$) are coupled to gate 23 the output ($\overline{BI}$) of which is coupled to quad latch 16.

The output from enabling gate 13 is also coupled to dual BCD counter 25 of display circuitry 9. This counter provides an input to BCD to 7 segment decoders 26, which decoders also receive the output ($\overline{BI}$) from gate 23, with the output from decoders 26 providing an input to display 27.

Referring to FIG. 2, frequency generator 11 is shown to include a pair of inverters 30 and 31 with inverter 30 having a resistor 32 connected in parallel therewith and the junction of resistor 32 and inverter 30 having a capacitor 33 to ground connected thereto. The output signal ($f_s$) coupled to counter divider 12 is coupled from the junction between inverters 30 and 31, while the second output ($\overline{f_s}$) is coupled from the output of inverter 31 to gate 13. Frequency generator 11 thus produces a scanning output signal at a predetermined scanning frequency, which signal is utilized both for timing and scanning purposes.

To reset counter divider 12 (as well as to start the count at counter divider 12), start switch 15 is momentarily closed and then opened. When switch 15 is closed, inverter 36 provides a high level at the RST input of counter divider 12 which resets the counter divider to zero. When switch 15 is then opened, inverter 36 (connected between switch 15 and counter divider 12 and having a capacitor 37 to ground at one side thereof) provides a low level at the RST input of counter divider 12 which allows counter divider 12 to start counting and provide high level pulses at its outputs. When inverter 36 provides a low level to the RST input of counter divider 12, the counter is enabled to count up to 9 where it stops due to the connection between output 9 and the enable input (EN) of counter divider 12, as shown in FIG. 2.

The outputs 4 and B of counter divider 12 are connected with the S4 and S3 inputs, respectively, of quad R-S NAND latch 16 through inverters 39 and 40, respectively. The high level pulses appearing at the outputs of counter divider 12 are inverted by inverters 39 and 40 so that low level pulses are supplied to the inputs S4 and S3 of quad latch 16. This sets the corresponding outputs (Q4 and Q3, respectively) of quad latch 16 so that enabling gate 13 is enabled to allow the scan output signal ($f_s$) to pass through the gate to dual binary up counter 19 (FIG. 2) and to dual BCD counter 25 (FIG. 4).

As also shown in FIG. 2, the output appearing at Q3 of quad latch 16 is coupled through inverter 41 to provide a reset signal ($\overline{RST}$), which signal is coupled to dual BCD counter 25 (FIG. 4). Quad latch 16 may be manually reset by closing manual reset switch 17 which is connected with the reset inputs (R4 and R3) of quad latch 16 through diodes 43, and quad latch 16 can also be externally reset by providing inputs to gate 44 which is likewise connected to the R4 and R3 inputs of quad latch 16 through diode 45.

Dual binary up counter 19 provides four binary outputs (A, B, C and D) to multiplexers 20. As brought out hereinabove, a plurality of multiplexer units are normally utilized as needed to enable testing of all of the wires of the cable by pairs. As indicated in FIG. 3, the inputs A, B, C and D are supplied to all of the units of multiplexer 20 that are utilized. In FIG. 3, only one multiplexer unit 20 A has been shown in detail, it being realized that the other units of multiplexer 20 utilized can be identical to the one unit illustrated in FIG. 3.

As shown in FIG. 3, multiplexer unit 20 A is a 16-line to 1-line multiplexer and has 16 inputs (E0 through E15) each of which is connected to a different terminal of input plug 21 A, which plug also has every other terminal grounded. Each input E0 through E15 is connected through a different resistor (commonly designated 48 in FIG. 3) to one side of potentiometer 49 the variable tap of which is connected to the voltage power supply (i.e., to the 12 volt battery source where such an internal power source is utilized). As also shown in FIG. 3 each of the inputs E0 through E15 is preferably connected to its associated input plug terminal through separate diodes (each of which is designated by the numeral 50 in FIG. 3). A single output ($\overline{Z}$) from each mutliplexer unit is provided with the output from unit 20 A being $\overline{Z0}$ as shown in FIG. 3.

By this arrangement, each multiplexer unit is caused to look sequentially at each one of its inputs (E0 through E15) in accordance with the input binary number provided on the input A, B, C and D. Resistors 48 provide a high level pull-up, potentiometer 49 is used for level setting in order to change the sensitivity of the device as desired, and diodes 50 are blocking diodes to protect the multiplexer against induced transients in the cable.

To test each pair of wires in the cable, it is only necessary that a bridging short be placed between the wire pairs at the end of the cable opposite to that connected with the testing apparatus so that the entire cable testing can be conducted at the cable end in contact with input plug 21 of the testing apparatus. With this arrangement, each pair of wires of the entire cable is sequentially tested by looking sequentially at the inputs E0 through E15 or each multiplexer unit. Thus, if no open is sensed by multiplexer unit 20 A (i.e., the unit senses only a low level at the corresponding input), a high level is provided at its output Z0. If, however, one of the wires in the pair then being tested is open, there is no path to ground in that pair, and multiplexer unit 20 A will see a high level (provided by the pull-up resistor connected with that particular E input), and a low level will thus be provided at output $\overline{Z0}$.

When a plurality of multiplexer units are being utilized, the BCD to decimal decoder 22 selects which of the multiplexer units that is to be then energized by providing separate output signals ($\overline{STB}$) to each unit. As shown in FIG. 3, with the input $\overline{STB0}$ active, multiplexer unit 20 A is energized for sequential testing of the wires of the cable connected with the unit. Obviously, only one multiplexer unit 20 is energized at any one time.

The outputs ($\overline{Z}$) from all of the multiplexer units are anded together at gate 23 as shown in FIG. 2. If all low levels appear at the multiplexer units inputs, then only high levels appear at gate 23 which causes a low level to be produced at the output ($\overline{BI}$) of gate 23 and this output is coupled to decoder 26 to blank display 27.

If however there is a low level at any of the multiplexer outputs ($\overline{Z0}$ through $\overline{Z5}$), this is indicative of a broken (open) wire and the output ($\overline{BI}$) of gate 23 goes high and this causes an output to be provided to gate 53 (which also receives an input signal from output 4 of counter divider 12 through inverter 39). The output of gate 53 is coupled to the reset input (R4) of quad latch 16, with the input signal thus supplied to R4 of quad latch 16 being a low signal to reset output Q4 of quad latch 16 to a low level, this disables gate 13 and hence terminates the scan signal (f$_s$) from being thereafter coupled to the dual binary up counter 19 and dual BC counter 25, and, of course, interrupts the scanning process. Since the output signal ($\overline{BI}$) from gate 23 has gone high at this point, BCD to seven segment decoders 26 are no longer blanked or inhibited, and display 27 is no longer disabled and hence can display the number corresponding to the pair of wires in the cable then being indicated as open.

As shown in FIG. 4, BCD to seven segment decoder 26 includes a pair of decoders 26A and 26B both of which are connected to the outputs of dual BC counter 25. As also shown in FIG. 4, the outputs from each of the decoder units 26A and 26B are coupled through resistors (designated generally as 55 and 56, respectively) to 27 which includes a pair of seven segment display units 27A and 27B where the indication of an open is displayed. As can be appreciated this display can be at the face of a small, portable, battery powered unit to readily determine the open then being sensed.

When a high level pulse is coupled from output B of counter divider 12, this pulse is converted to a low level pulse by inverter 40 to thus set the output Q3 of quad latch 16 high. This high level is then converted to a low level by inverter 41 the output ($\overline{RST}$) of which is coupled to the reset (RST) and clock (CK) inputs of dual binary up counter 19 and dual BCD counter 25 which enables them to thereafter count.

In FIG. 5, the apparatus of this invention is shown connected to two wires of cable 58, this being typical of all connections of the wires of a multi-wire cable to the apparatus for monitoring of the wires by pairs. As shown, wires 59 and 60 of cable 58 are connected at plug 21. A shorting plug 62 is also shown connected through plug 63 to the other end of the wires so that a connection through each pair of wires to ground is established unless an open exists in either wire (i.e., in either of wires 59 or 60 as shown in FIG. 5). If no open is sensed, then a low level signal is established at the multiplexer because of the continuity of wires 59 and 60 through the shorting bar or plug 62. If, however, an open does exist in either of the wires 59 or 60, an output is provided from the multiplexer at output $\overline{Z0}$ through the action of the pull-up resistor 48. This then causes interruption of monitoring, or scanning, by the apparatus and, as brought out hereinabove, enables a display to be presented at the apparatus showing the wires then being sensed as open. For example, of 80 pairs of wires are being tested and the scan is interrupted after 52 pairs have been tested as good, the number 53 will be displayed at digital readout display 27.

Monitoring is resumed by momentarily closing start switch 15, and monitoring, or scanning, will then continue until completion of the scan or until an additional pair of wires is sensed as open. If an additional open is sensed, monitoring will again be interrupted and the open pair of wires identified. After completion of testing, bad cables can then be sent to be repaired with an indication tag, indicating which pair or pairs of wires are open, thus, eliminating cable trouble shooting at that time.

As can be appreciated from the foregoing, the improved cable testing apparatus and method of this invention provides a reliable device and method for rapidly indicating opens in the wires of a multi-wire cable.

What is claimed is:

1. A cable testing apparatus for testing the wires of a multi-wire cable for opens, said apparatus comprising:

input means adapted to be connected to a multi-wire cable to enable testing for opens in wires of said cable that has been directly electrically connected at one end to form wire pairs, said input means including signal routing means connectable with the other end of said wires of said cables for maintaining different pairs of wires of said cable so connected electrically separated from one another and for producing a distinguishable indication whenever a said pair of wires of said cable is sensed to be open;

indicating means connected with said signal routing means to receive said distinguishable indication of an open therefrom, said indicating means including digital display means; and control means connected with said indicating means and said signal routing means for causing automatic sequential monitoring of said pairs of wires of said cable when so connected to said input means and for causing interruption of said sequential monitoring with said display means being caused to produce a discernable digital indication of an open then sensed at said input means.

2. The apparatus of claim 1 wherein said input means includes a multi-terminal plug for adapting said apparatus for connection to said other end of said wires of said multi-wire cable to be tested for opens, and wherein said signal routing means includes multiplexer means for causing monitoring of said wires of said cable.

3. The apparatus of claim 2 wherein said input means includes means for connecting said pairs of wires between a power source and ground to enable continuity testing of said pairs of wires.

4. The apparatus of claim 1 wherein said control means includes timing means for controlling sequential monitoring of said wires of said cable and for determining the indication to be provided by said indicating means when an open is sensed by said signal routing means.

5. The apparatus of claim 4 wherein said timing means includes a frequency generator and counter means.

6. The apparatus of claim 1 wherein said indicating means includes counter means and decoder means connected with said display means and said signal routing means.

7. The apparatus of claim 1 wherein said apparatus is portable, and wherein said input means is adapted for connection to a seismic cable so that said apparatus is suitable for final check-out of seismic cables in field operations.

8. A cable testing apparatus for testing the wires of a multi-wire cable for opens, said apparatus comprising:
   a plug having first and second sets of terminals thereon, said plug being adapted to receive a multi-wire cable the wires of which can be paired for electrical conduction therethrough unless at least one of said wires of a pair is open, with said wires of each pair being electrically connected with opposite ones of said first and second sets of terminals of said plug;
   connector means for connecting said first set of terminals with a power source and for connecting said second set of terminals with ground;
   multiplexer means connected with said plug for sequentially monitoring each pair of wires connected with said sets of terminals, said multiplexer means providing an output indicative of a sensed open found during said monitoring;
   signal generating means for providing a timing signal output;
   first counter means connected with said signal generating means to receive said timing signal output therefrom and responsive thereto providing a control signal for causing said sequential monitoring of said pairs of wires of said cable by said multiplexer means;
   second counter means connected with said signal generating means to receiving said timing signal output therefrom and responsive thereto providing an indication of the pair of wires then being monitored by said apparatus; and
   display means connected with said second counter means and said multiplexer means for displaying an indication of the pair of wires sensed by said apparatus to be then open.

9. The apparatus of claim 8 wherein said connecting means includes pull-up resistor means connected between each of said first set of terminals of said plug and said power source, said pull-up resistor means operating in conjunction with said multiplexer means to provide said output indicative of a sensed open in said pair of wires then being monitored.

10. The apparatus of claim 8 wherein said multiplexer means includes at least one 16-line to 1-line multiplexer unit.

11. The apparatus of claim 8 wherein said multiplexer means includes a plurality of 16-line to 1-line multiplexer units, and wherein said apparatus includes means connected with said second counter means for sequentially selecting each multiplexer unit for monitoring to determine opens in the wires of a multi-wire cable connected with all of said multiplexer units.

12. The apparatus of claim 8 wherein said first counter means is a dual binary up counter.

13. The apparatus of claim 8 wherein said second counter means is dual BCD counter and wherein said display means includes a BCD to 7 segment decoder means connected with said dual BCD counter.

14. The apparatus of claim 8 wherein said apparatus includes means connected with said multiplexer means and said display means and said first counter means to interrupt sequential monitoring of said wires of said cable whenever an output indication of a sensed open is provided by said multiplexer means.

15. A seismic cable testing apparatus for testing by pairs the wires of a multi-wire seismic cable for opens, said apparatus comprising:
   a plug having first and second sets of terminals thereon, said plug being adapted to receive one end of the wires of a multi-wire cable, said wires being grouped into predetermined pairs by electrical connection of each pair at the opposite end of said wires of said cable, with said wires of each pair being connected with opposite ones of said first and second sets of terminals of said plugs;
   a power source;
   pull-up resistor means connecting said power source with said first set of terminals of said plug;
   connecting means for connecting said second set of terminals with ground;
   multiplexer means having input means, a plurality of outputs each of which is connected with a different one of said first set of terminals, and an open indicating output for indicating an open sensed in any pair of said wires;
   signal generating means for generating a timing signal output;
   a decade counter divider for receiving said timing signal output;
   a start switch for initiating counting by said decade counting divider;
   a quad latch for receiving the counting output from said counter divider;
   an enabling gate connected with said signal generating means and said quad latch to gate said timing signal therethrough;
   a dual binary up counter for receiving said timing signal gated through said enabling gate, said dual binary up counter providing an input to said multiplexer means to control operation thereof so that said multiplexer means sequentially monitors each of said pairs of wires of a seismic cable connected with said plugs;
   a dual BCD counter connected with said enabling gate to receive said timing signal gated therethrough, said BCD counter providing a counter output;
   a BCD to 7 segment decoder connected with said dual BCD counter to receive said count therefrom and provide a 7 segment output;
   a display unit for digitally displaying the count decoded by said BCD to 7 segment decoder; and
   gate means connected with said open indicating output of said multiplexer means to receive said open indication therefrom, said gate means being connected with said quad latch and said BCD to 7 segment decoder to terminate sequential monitoring of said wires of said cable and to cause display of said pair of wires then being sensed as open.

16. The apparatus of claim 15 wherein said multiplexer means includes a plurality of multiplexer units, and wherein said apparatus includes a BCD to decimal decoder connected with said dual binary up counter and said multiplexer units to control dequential actuation of each multiplexer unit.

17. A method for testing the wires of a multi-wire cable, said method comprising:
grouping the wires of a multi-wire cable into first and second groups with the ends of each group being adjacent to one another at opposite ends;
at one end of said cable electrically connecting each wire of said first group to a different wire of said second group so that said wires are electrically paired;
at the other end of said cable sequentially automatically monitoring the electrically paired groups of wires to determine if an open exists in any group;
interrupting said sequential monitoring of said electrically paired wire whenever an open is sensed; and
digitally displaying an indication of the electrically paired wire then sensed to be open.

18. The method of claim 17 wherein said method includes connecting each of said electrically paired wires to a power source through resistance means at one end of said pair and to ground at the other end of said pair.

19. The method of claim 17 wherein said method includes resuming monitoring of the electrically paired wires after said open has been displayed, and continuing such monitoring until monitoring is completed or an additional open is sensed in said electrically paired wires.

* * * * *